United States Patent
Nelson et al.

(10) Patent No.: US 8,139,371 B2
(45) Date of Patent: Mar. 20, 2012

(54) POWER ELECTRONICS DEVICES WITH INTEGRATED CONTROL CIRCUITRY

(75) Inventors: David F. Nelson, Agoura Hills, CA (US); George John, Cerritos, CA (US); Gregory S. Smith, Woodland Hills, CA (US); David Tang, Fontana, CA (US); James M. Nagashima, Cerritos, CA (US); Gabriel Gallegos-Lopez, Torrance, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 525 days.

(21) Appl. No.: 12/178,478

(22) Filed: Jul. 23, 2008

(65) Prior Publication Data

US 2009/0033410 A1 Feb. 5, 2009

Related U.S. Application Data

(60) Provisional application No. 60/952,778, filed on Jul. 30, 2007.

(51) Int. Cl.
*H05K 7/00* (2006.01)

(52) U.S. Cl. ........................... 361/781; 361/760

(58) Field of Classification Search .............. 361/781, 361/802, 698, 719, 716, 760; 174/250, 262; 257/723, 724, 787

See application file for complete search history.

(56) References Cited

U.S. PATENT DOCUMENTS

| | | | |
|---|---|---|---|
| 5,229,633 A | 7/1993 | Fisher et al. | |
| 5,453,911 A | 9/1995 | Wolgemuth et al. | |
| 5,703,399 A * | 12/1997 | Majumdar et al. | 257/723 |
| 6,411,514 B1 | 6/2002 | Hussaini | |
| 6,809,387 B2 | 10/2004 | Kameda | |
| 6,833,628 B2 | 12/2004 | Brandenburg et al. | |
| 2002/0162673 A1 | 11/2002 | Cook et al. | |
| 2004/0037044 A1 * | 2/2004 | Cook et al. | 361/719 |
| 2004/0100778 A1 | 5/2004 | Vinciarelli et al. | |
| 2005/0128706 A1 | 6/2005 | Maly et al. | |
| 2005/0213301 A1 | 9/2005 | Prasher | |
| 2006/0092611 A1 * | 5/2006 | Beihoff et al. | 361/698 |
| 2006/0152644 A1 | 7/2006 | Yi | |
| 2007/0177352 A1 | 8/2007 | Monfarad et al. | |
| 2009/0033410 A1 | 2/2009 | Nelson et al. | |

(Continued)

FOREIGN PATENT DOCUMENTS

CN 2150672 Y 12/1993

(Continued)

OTHER PUBLICATIONS

Shah, H. N., et al., "Power Electronics Modules for Inverter Applications Using flip-Chip on Flex-Circuit Technology," IEEE Industry Applications Conference, Oct. 2004, pp. 1526-1533, vol. 3.

(Continued)

*Primary Examiner* — Yuriy Semenenko

(74) *Attorney, Agent, or Firm* — Ingrassia Fisher & Lorenz, P.C.

(57) ABSTRACT

A power switch apparatus includes a substrate; a semiconductor die mounted on the substrate and including power electronics circuitry for a high power, alternating current motor application; gate drive circuitry mounted on the substrate and electrically coupled to the power electronics circuitry on the semiconductor die; and control circuitry mounted on the substrate and electrically coupled to the gate drive circuitry.

9 Claims, 2 Drawing Sheets

U.S. PATENT DOCUMENTS

2009/0072770 A1\* 3/2009 Son et al. .................. 318/139
2009/0087322 A1\* 4/2009 Toyama et al. ............ 417/410.1
2010/0225258 A1\* 9/2010 Namuduri et al. ......... 318/400.3

FOREIGN PATENT DOCUMENTS

CN           1810557 A     8/2006

OTHER PUBLICATIONS

Chu, L. H-S., "Better Power Packages Make Better Circuits," Power Electronics Technology, May 2007, pp. 42-46.

Nelson, D. F., et al., "Power Electronics Devices With Integrated Gate Drive Circuitry," U.S. Appl. No. 12/178,847, filed Jul. 24, 2008.

U.S. Office Action dated Mar. 31, 2010, issued in U.S. Appl. No. 12/178,847.

Response to Office Action dated Mar. 31, 2010, filed in U.S. Appl. No. 12/178,847.

U.S. Office Action dated Aug. 25, 2010, issued in U.S. Appl. No. 12/178,847.

Chinese Office Action for Chinese Application No. 200810214763.0 mailed Jan. 26, 2011.

Notice of Allowance for U.S. Appl. No. 12/178,847 mailed Feb. 28, 2011.

Fleurial, et al. "Thermoelectric Microcoolers for Thermal Management Applications," Proceedings of the XVI International Conference on Thermoelectrics, Dresden Germany, Aug. 26-29, 1997.

Advances in Electronic Packaging 2003, presented at [the] International Electronic Packaging Technical Conference and Exhibition, by Maui, Jul. 6-11, 2003.

Response to U.S. Office Action for U.S. Appl. No. 12/178,847 mailed Nov. 23, 2010.

Chinese Office Action for Chinese Application No. 200810215455 mailed Oct. 23, 2009.

\* cited by examiner

POWER ELECTRONICS DEVICES WITH INTEGRATED CONTROL CIRCUITRY

CROSS-REFERENCE TO RELATED APPLICATION

This application claims the benefit of U.S. provisional patent application Ser. No. 60/952,778, filed Jul. 30, 2007, which is incorporated herein by reference in its entirety.

TECHNICAL FIELD

The present invention generally relates to power electronics devices, and more particularly relates to power electronics devices with integrated control circuitry.

BACKGROUND OF THE INVENTION

In recent years, advances in technology, as well as ever-evolving tastes in style, have led to substantial changes in the design of automobiles. One of the changes involves the complexity of the electrical systems within automobiles, particularly alternative fuel vehicles, such as hybrid, electric, and fuel cell vehicles. Such alternative fuel vehicles typically use one or more electric motors, perhaps in combination with another actuator, to drive the wheels. Additionally, such automobiles may also include other motors, as well as other high voltage components, to operate the other various systems within the automobile, such as the air conditioner.

Due to the fact that alternative fuel automobiles typically include only direct current (DC) power supplies, direct current-to-alternating current (DC/AC) inverters (or power inverters) are provided to convert the DC power to alternating current (AC) power, which is generally required by the motors. Such vehicles, particularly fuel cell vehicles, also often use two separate voltage sources, such as a battery and a fuel cell, to power the electric motors that drive the wheels. Thus, power converters, such as direct current-to-direct current (DC/DC) converters, are typically also provided to manage and transfer the power from the two voltage sources.

As the power demands on the electrical systems in alternative fuel vehicles continue to increase, there is an ever increasing need to maximize the efficiency and reliability of such systems. Additionally, there is a constant desire to reduce the cost and space required by the components within the electrical systems in order to minimize the overall cost and weight of the vehicles. One particular source of increased cost is the direct bonded copper substrates conventionally required of many power inverters.

Therefore, it is desirable to provide a power electronics device, particularly an inverter, with attributes of low cost, high current, and compact design. Furthermore, other desirable features and characteristics of the present invention will become apparent from the subsequent detailed description and the appended claims, taken in conjunction with the accompanying drawings and the foregoing technical field and background.

SUMMARY OF THE INVENTION

In accordance with an exemplary embodiment, a power switch apparatus includes a substrate; a semiconductor die mounted on the substrate and including power electronics circuitry for a high power, alternating current motor application; gate drive circuitry mounted on the substrate and electrically coupled to the power electronics circuitry on the semiconductor die; and control circuitry mounted on the substrate and electrically coupled to the gate drive circuitry.

In accordance with another exemplary embodiment, an automotive drive system includes an electric motor; a direct current (DC) power supply coupled to the electric motor; a power inverter assembly coupled to the electric motor and the DC power supply to receive DC power from the DC power supply and provide alternating current (AC) power to the electric motor. The power inverter assembly includes a substrate; a semiconductor die mounted on the substrate and including power electronics circuitry for converting the DC power to AC power; gate drive circuitry mounted on the substrate and electrically coupled to the power electronics circuitry on the semiconductor die; and control circuitry mounted on the substrate and electrically coupled to the gate drive circuitry.

In accordance with yet another exemplary embodiment, a power switch apparatus includes a printed circuit board (PCB) substrate with a first side and a second side; a plurality of semiconductor die mounted on the first side of the substrate, the semiconductor die including insulated gate bipolar transistors (IGBTs) for a high power, alternating current motor application; gate drive circuitry mounted on the first side of the substrate and electrically coupled to the IGBTs of the semiconductor die; control circuitry mounted on the second side of the substrate and electrically coupled to the gate drive circuitry with an interconnect formed in a via through the substrate; and an EMI shield formed in the substrate to isolate the control circuitry from the semiconductor die.

DESCRIPTION OF THE DRAWINGS

The present invention will hereinafter be described in conjunction with the following drawing figures, wherein like numerals denote like elements, and wherein.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Broadly, exemplary embodiments described herein provide more compact and less expensive power electronics devices. More particularly, exemplary embodiments provide an inverter assembly with semiconductor die, gate drive circuitry, and control circuitry mounted on a relatively low cost substrate.

The following description refers to elements or features being "connected" or "coupled" together. As used herein, "connected" may refer to one element/feature being mechanically joined to (or directly communicating with) another element/feature, and not necessarily directly. Likewise, "coupled" may refer to one element/feature being directly or indirectly joined to (or directly or indirectly communicating with) another element/feature, and not necessarily mechanically. However, it should be understood that although two elements may be described below, in one embodiment, as being "connected," in alternative embodiments similar elements may be "coupled," and vice versa. Thus, although the schematic diagrams shown herein depict example arrangements of elements, additional intervening elements, devices, features, or components may be present in an actual embodiment.

Further, various components and features described herein may be referred to using particular numerical descriptors, such as first, second, third, etc., as well as positional and/or angular descriptors, such horizontal and vertical. However, such descriptors may be used solely for descriptive purposes relating to drawings and should not be construed as limiting, as the various components may be rearranged in other embodiments. It should also be understood that FIGS. 1 and 2 are merely illustrative and may not be drawn to scale.

Figure 1:
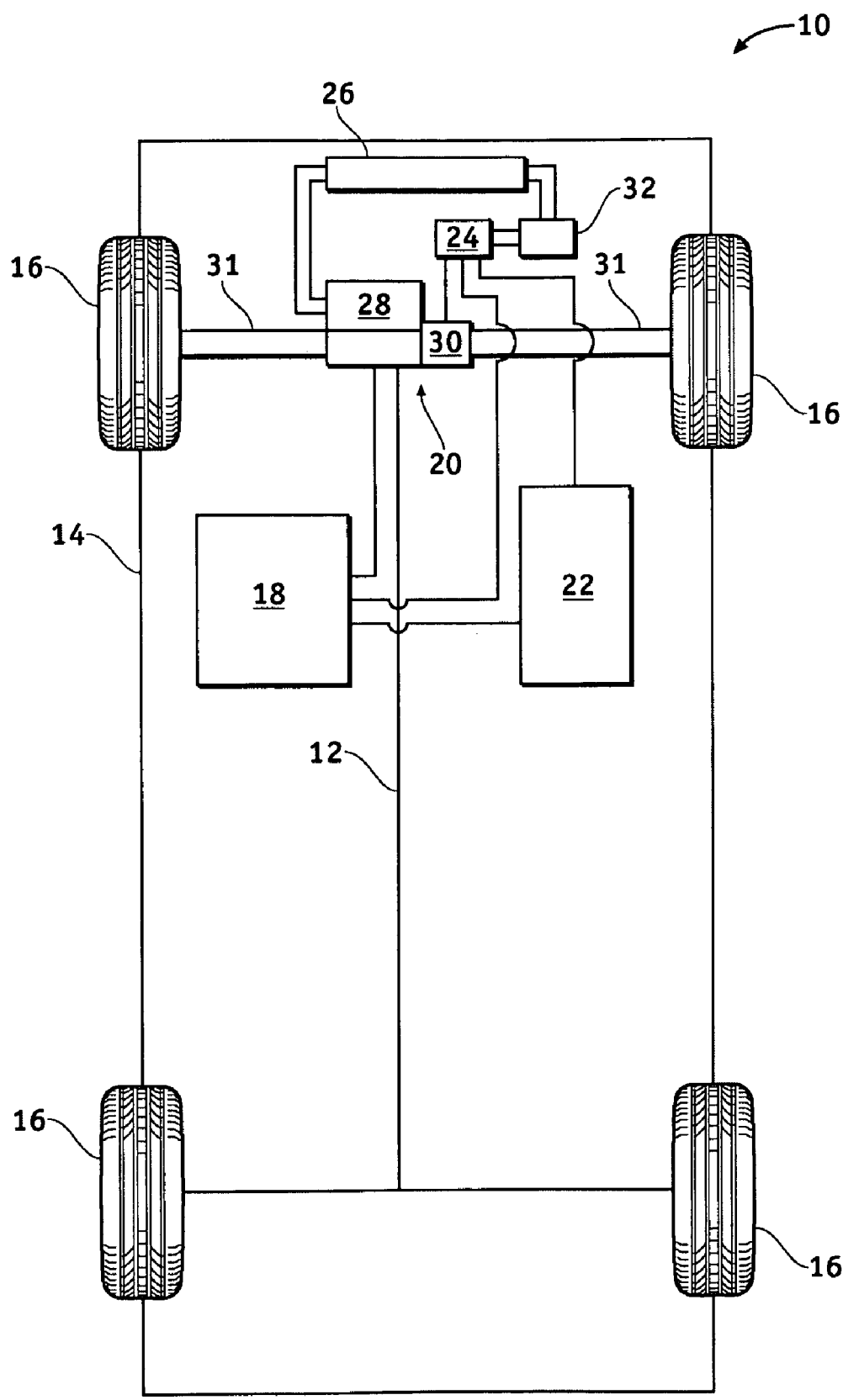
FIG. 1 is a schematic view of an exemplary automobile according to one embodiment of the present invention.
Figure 2:
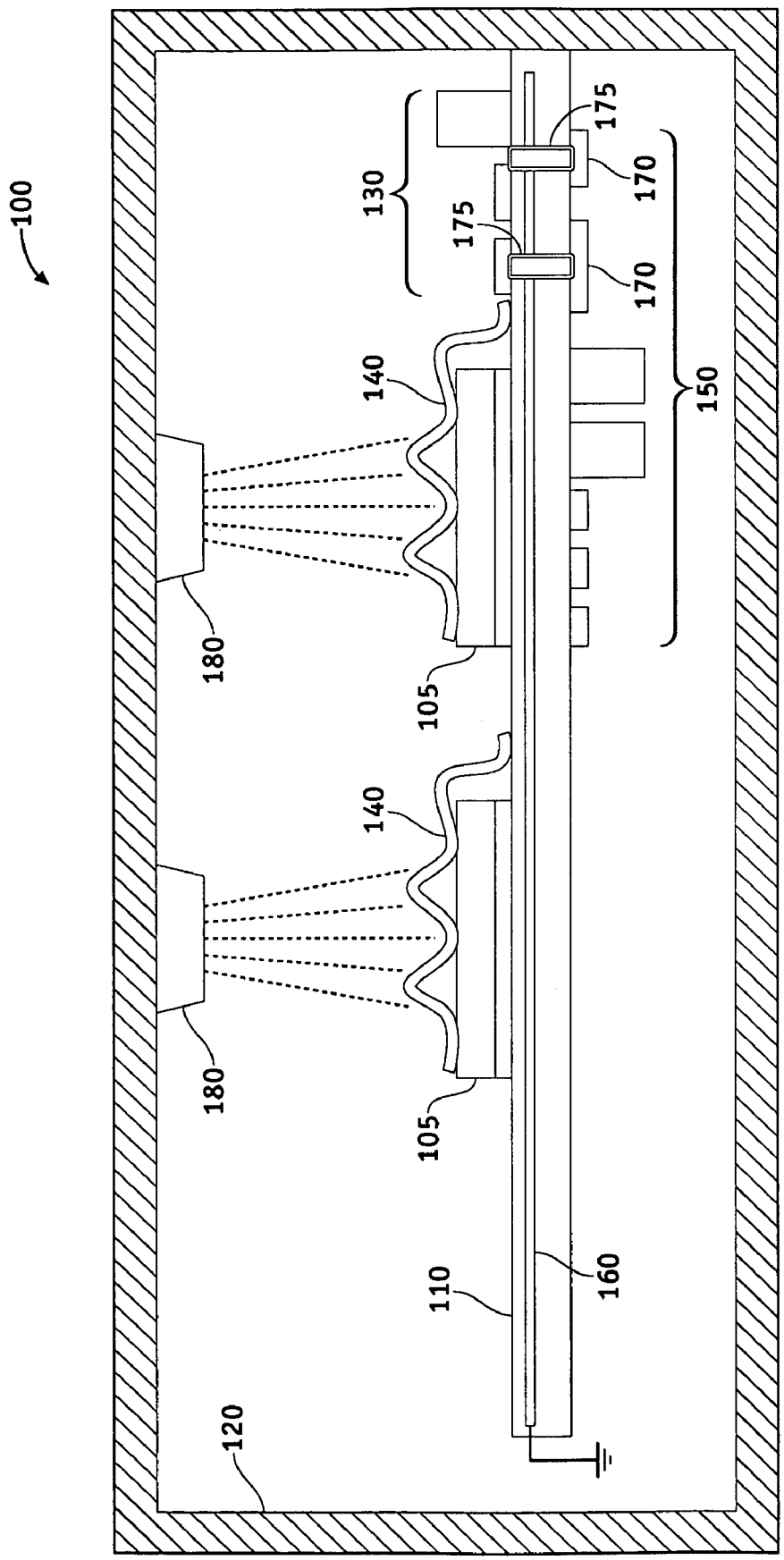
FIG. 2 is an exemplary layout of a power switch apparatus of the inverter assembly of the automobile of FIG. 1.

FIG. 1 illustrates an automobile (or "automotive drive system") 10, according to one embodiment of the present invention. The automobile 10 includes a chassis 12, a body 14, a number of wheels 16, and an electronic control system 18. The body 14 is arranged on the chassis 12 and substantially encloses the other components of the automobile 10. The body 14 and the chassis 12 may jointly form a frame. The wheels 16 are each rotationally coupled to the chassis 12 near a respective corner of the body 14.

The automobile 10 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD), or all-wheel drive (AWD). The automobile 10 may also incorporate any one of, or combination of, a number of different types of engines, such as, for example, a gasoline or diesel fueled combustion engine, a "flex fuel vehicle" (FFV) engine (i.e., using a mixture of gasoline and alcohol), a gaseous compound (e.g., hydrogen and/or natural gas) fueled engine, a combustion/electric motor hybrid engine, and an electric motor.

In the exemplary embodiment illustrated in FIG. 1, the automobile 10 is a hybrid vehicle, and further includes an actuator assembly 20, a battery (or direct current (DC) power supply) 22, a power electronics device 24, and a radiator 26. In this exemplary embodiment, the power electronic device 24 is an inverter assembly and will be referred to below as such. The actuator assembly 20 includes a combustion engine 28 and an electric motor/generator (or motor) 30. As will be appreciated by one skilled in the art, the electric motor 30 includes a transmission therein, and although not illustrated also includes a stator assembly (including conductive coils), a rotor assembly (including a ferromagnetic core), and a cooling fluid (i.e., coolant). The stator assembly and/or the rotor assembly within the electric motor 30 may include multiple electromagnetic poles (e.g., sixteen poles), as is commonly understood.

Still referring to FIG. 1, in one embodiment, the combustion engine 28 and the electric motor 30 are integrated such that both are mechanically coupled to at least some of the wheels 16 through one or more drive shafts 32. The radiator 26 is connected to the frame at an outer portion thereof and although not illustrated in detail, includes multiple cooling channels therein that contain a cooling fluid (i.e., coolant) such as water and/or ethylene glycol (i.e., "antifreeze") and is coupled to the engine 28 and the inverter assembly 24.

During operation, the vehicle 10 is operated by providing power to the wheels 16 with the combustion engine 28 and the electric motor 30 in an alternating manner and/or with the combustion engine 28 and the electric motor 30 simultaneously. In order to power the electric motor 30, DC power is provided from the battery 22 to the inverter assembly 24, which converts the DC power into AC power, before the power is sent to the electric motor 30. As will be appreciated by one skilled in the art, the conversion of DC power to AC power is substantially performed by operating (i.e., repeatedly switching) transistor circuitry in power switches of the inverter assembly 24, as discussed below in reference to FIG. 2.

Referring to FIG. 2, an exemplary layout of a power switch apparatus 100 in the inverter assembly 24 is shown in greater detail. Generally, one or more power switch apparatus 100 form an inverter assembly 24. The power switch apparatus 100 and larger inverter assembly 24 are each considered a "power electronics" device. Generally, power electronics is technology associated with the efficient conversion, control and conditioning of electric power by static means from its available input form into the desired electrical output form. Such conversion is performed with semiconductor switching devices such as diodes, thyristors and transistors, and substantial amounts of electrical energy are processed. In contrast, other electronic systems are concerned with transmission and processing of signals and data and do not process substantial amounts of energy.

The power switch apparatus 100 particularly includes semiconductor die 105 mounted on a substrate 110 and enclosed in a housing 120. The semiconductor die 105 may be soldered to the substrate 110, although other arrangements are also possible. The semiconductor die 105 may include a semiconductor substrate (e.g., silicon substrate) with an integrated circuit formed thereon that includes one or more of the switches in the form of individual semiconductor devices, such as insulated gate bipolar transistors (IGBTs), as is commonly understood. In one embodiment, semiconductor die 100 generally includes a three-phase circuit coupled to the motor 30 and the battery 22 (FIG. 1).

In one embodiment, the substrate 110 is a relatively low cost substrate, such as a PCB. The substrate can be, for example, an epoxy/fiberglass material, although other material can be used. Standard PCB techniques can be used to mount and interconnect the various components on the substrate 110. Generally, the power switch apparatus 100 does not require a direct, or double, bonded copper (DBC) substrate or other type of substrate with high thermal conductivity. Although a single substrate 110 is shown with two semiconductor die 105, additional or few semiconductor die can be provided, as well as additional substrates that form, for example, a switch module.

Gate drive circuitry 130 is formed on the substrate 110. Generally, the gate drive circuitry 130 converts logic level control signals into the appropriate voltage and current for efficient, reliable switching of the power switch apparatus 100, particularly the circuitry that forms the IGBTs on the semiconductor die 105. In conventional power switches, gate drive circuitry is provided on a separate substrate.

The power switch apparatus 100 also includes a number of wire bonds 140 that interconnect the semiconductor die 105 to various conductive members (e.g., bus bars) formed in or on the substrate 110 such that the semiconductor die 105 is electrically coupled to the gate drive circuitry 130, and the gate drive circuitry 130 can be coupled to components outside of the power switch apparatus 100.

Exemplary embodiments provide a power switch apparatus 100 with integrated gate drive circuitry 130 that requires fewer interconnects than conventional assemblies. For example, a separate gate drive board is not necessary.

In one exemplary embodiment, control circuitry 150 can additionally be mounted on the substrate 110. The control circuitry 150 can include or be coupled to various sensors and automotive control modules, or electronic control units (ECUs), such as an inverter control module and a vehicle controller, and at least one processor and/or a memory which includes instructions stored thereon (or in another computer-readable medium) for carrying out the processes of the inverter assembly 24. Generally, the control circuitry 150 produces a Pulse Width Modulation (PWM) signal for controlling the switching action of the circuitry on the semiconductor die 105, which then converts the PWM signal to a modulated voltage waveform for operating the motor 30 (FIG. 1).

In the exemplary depicted embodiment, the control circuitry 150 is mounted on an opposite side of the substrate 110 relative to the semiconductor die 105 and gate drive circuitry 130, although in other embodiments, the control circuitry 150 can be mounted on the same side of the substrate 110 as the semiconductor die 105 and gate drive circuitry 130. Mounting the control circuitry 150 on an opposite side relative to the semiconductor die 105 and gate drive circuitry 130 provides isolation, particularly with an EMI shield 160 formed within the substrate 110. This isolation enables the relatively high voltage circuitry on the semiconductor die 105 and the relatively low voltage components of the control circuitry 150 to operate without interference. The EMI shield 160 can be, for example, a layer of grounded, conductive material within the substrate 110. In conventional power switches, gate drive circuitry is provided on a separate substrate.

The control circuitry 150 can be coupled to the gate drive circuitry 130 through the substrate 110 with, for example, interconnects 170 in vias 175. The vias 175 can be formed, for example, by laser drilling or punching, and in one embodiment, filled by thick film techniques. Thick film is a technique of filling the vias 175 with a slurry or paste of one or more of un-fired ceramic materials and metal powders, usually gold, and then firing the slurry or paste to create the interconnects 170.

Exemplary embodiments provide a power switch apparatus 100 of an inverter assembly 24 with integrated control circuitry 150 that requires fewer interconnects than conventional assemblies. For example, a separate control board is not necessary. This enables additional flexibility and creativity in the electrical design.

As noted above, the power switch apparatus 100 also includes the housing 120 that encloses the semiconductor die 105, substrate 110, and associated circuitry. The housing 34 may be made of a molded plastic material or any other suitable material.

During operation, the semiconductor die 105 generates heat. In one embodiment, the semiconductor die 105 generates a heat flux density of at least 10 $W/cm^2$, while in another embodiment, generates a heat flux density of at least 20 $W/cm^2$. In order to remove heat from the semiconductor die 105, the fluid within the radiator 26 is circulated by the pump 32 (FIG. 1) to one or more nozzles 180 within the power switch apparatus 100. The fluid is sprayed through the nozzles 180 onto the semiconductor die 105. Heat from the semiconductor die 105 conducts to the fluid before the fluid runs off. The fluid may then be collected and returned to the radiator 26, by the pump 32, to be cooled within the cooling channels of the radiator 26 (FIG. 1). The coolant fluid is preferably a dielectric liquid. As will be apparent to one skilled in the art, the particular dielectric liquid selected will depend upon device chemistry and application. Suitable dielectric liquids may include, but are not limited to, fluorocarbons, silicone oils, and polyalphaolefins. In this exemplary embodiment, the power switch apparatus 100 and/or inverter assembly 24 does not include a heat sink. Other examples of heat removal include atomizers and other cooling mechanisms.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A power switch apparatus, comprising:
   a printed circuit board (PCB) substrate with a first side and a second side;
   a plurality of semiconductor die mounted on the first side of the substrate, the semiconductor die including insulated gate bipolar transistors (IGBTs) for a high power, alternating current motor application;
   gate drive circuitry mounted on the first side of the substrate and electrically coupled to the IGBTs of the semiconductor die;
   control circuitry mounted on the second side of the substrate and electrically coupled to the gate drive circuitry with an interconnect formed in a via through the substrate; and
   an EMI shield formed in the substrate to isolate the control circuitry from the semiconductor die.

2. The power switch apparatus of claim 1, wherein the power electronics circuitry includes insulated gate bipolar transistors (IGBTs).

3. The power switch apparatus of claim 1, wherein the semiconductor die is mounted on the substrate with solder.

4. The power switch apparatus of claim 1, wherein the gate drive circuitry is configured to receive logic level control signals from the control circuitry and to convert the control signals into appropriate voltage and current for controlling switching of the power electronics circuitry.

5. The power switch apparatus of claim 1, further comprising wire bonds for electrically coupling the gate drive circuitry to the power electronics circuitry on the semiconductor die.

6. The power switch apparatus of claim 1, further comprising a housing for enclosing the substrate and the semiconductor die.

7. The power switch apparatus of claim 6, further comprising nozzles coupled to the housing for delivering a cooling fluid to the semiconductor die.

8. An automotive drive system comprising:
   an electric motor;
   a direct current (DC) power supply coupled to the electric motor;
   a power switch apparatus coupled to the electric motor and the DC power supply to receive DC power from the DC power supply and provide alternating current (AC) power to the electric motor, the power switch apparatus comprising:
   a printed circuit board (PCB) substrate with a first side and a second side;
   a semiconductor die mounted on the first side of the substrate and comprising power electronics circuitry for converting the DC power to AC power;
   gate drive circuitry mounted on the first side of the substrate and electrically coupled to the power electronics circuitry on the semiconductor die;

control circuitry mounted on the second side of the substrate and electrically coupled to the gate drive circuitry with an interconnect formed in a via through the substrate; and an EMI shield formed in the substrate to isolate the control circuitry from the semiconductor die.

9. The automotive drive system of claim 8, wherein the power electronics circuitry includes insulated gate bipolar transistors (IGBTs).

* * * * *